United States Patent
Dunlap et al.

(10) Patent No.: US 8,337,657 B1
(45) Date of Patent: Dec. 25, 2012

(54) MECHANICAL TAPE SEPARATION PACKAGE AND METHOD

(75) Inventors: Brett Arnold Dunlap, Queen Creek, AZ (US); Robert Francis Darveaux, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 168 days.

(21) Appl. No.: 12/913,325

(22) Filed: Oct. 27, 2010

(51) Int. Cl.
- *B29C 65/50* (2006.01)
- *B32B 37/26* (2006.01)
- *B32B 38/10* (2006.01)

(52) U.S. Cl. ......... 156/247; 156/701; 156/714; 156/718
(58) Field of Classification Search .................. 156/247, 156/250, 254, 701, 714, 718
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,870,476 A * | 9/1989 | Solstad ................ 257/668 |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |

(Continued)

FOREIGN PATENT DOCUMENTS

JP 05-109975 4/1993
(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Sing P Chan
(74) *Attorney, Agent, or Firm* — McKay and Hodgson, LLP; Serge J. Hodgson

(57) ABSTRACT

A method of fabricating a plurality of electronic component packages includes coupling a tape to a panel. Electronic components are coupled to the tape and encapsulated to form a molded wafer. The molded wafer is mechanically separated from the panel without heating by breaking a mechanical separation adhesive of the tape. By mechanically separating the molded wafer from the panel without heating, warpage of the molded wafer associated with heating is avoided.

19 Claims, 7 Drawing Sheets

U.S. PATENT DOCUMENTS

| | | |
|---|---|---|
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,202,107 B2 | 4/2007 | Fuergut et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,863,088 B2 * | 1/2011 | Brunnbauer et al. ......... 438/106 |
| 8,035,213 B2 * | 10/2011 | Lee et al. ...................... 257/692 |
| 8,193,647 B2 * | 6/2012 | Hsieh et al. ................... 257/797 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0046002 A1 | 3/2005 | Lee et al. |
| 2005/0139985 A1 | 6/2005 | Takahashi |
| 2005/0242425 A1 | 11/2005 | Leal et al. |
| 2006/0008944 A1 | 1/2006 | Shizuno |
| 2006/0270108 A1 | 11/2006 | Farnworth et al. |
| 2007/0273049 A1 | 11/2007 | Khan et al. |
| 2007/0281471 A1 | 12/2007 | Hurwitz et al. |

| | | |
|---|---|---|
| 2007/0290376 A1 | 12/2007 | Zhao et al. |
| 2008/0230887 A1 | 9/2008 | Sun et al. |
| 2011/0119910 A1* | 5/2011 | Xu et al. .................. 29/832 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58$^{th}$ ECTC Proceedings, May 2008, Lake Buena Vista, FL, 6 pages, IEEE.

Nitto Denko, "Thermal Release Tape: REVALPHA No. 3195V", Technical Data Sheet, 1 page.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

Hiner et al., "Semiconductor Package Including Top-Surface Terminals for Mounting Another Semiconductor Package", U.S. Appl. No. 12/802,661, filed Jun. 10, 2010.

Scanlan et al., "Semiconductor Package Including a Top-Surface Metal Layer for Implementing Circuit Features", U.S. Appl. No. 12/802,715, filed Jun. 10, 2010.

Scanlan, "Stacked Redistribution Layer (RDL) Die Assembly Package", U.S. Appl. No. 12/924,493, filed Sep. 27, 2010.

* cited by examiner

Mechanical tape separation package formation method 100

MECHANICAL TAPE SEPARATION PACKAGE AND METHOD

TECHNICAL FIELD

The present application relates to the field of electronics, and more particularly, to methods of forming electronic component packages and related structures.

BACKGROUND

To form an electronic component package, dies are mounted to a thermal release tape mounted to a panel. After encapsulating the dies to form a molded wafer, the thermal release tape is heated to release the molded wafer from the panel. However, heating the thermal release tape causes undesirable warpage in the molded wafer.

BRIEF DESCRIPTION OF THE DRAWINGS

In the following description, the same or similar elements are labeled with the same or similar reference numbers.

DETAILED DESCRIPTION

Figure 2:
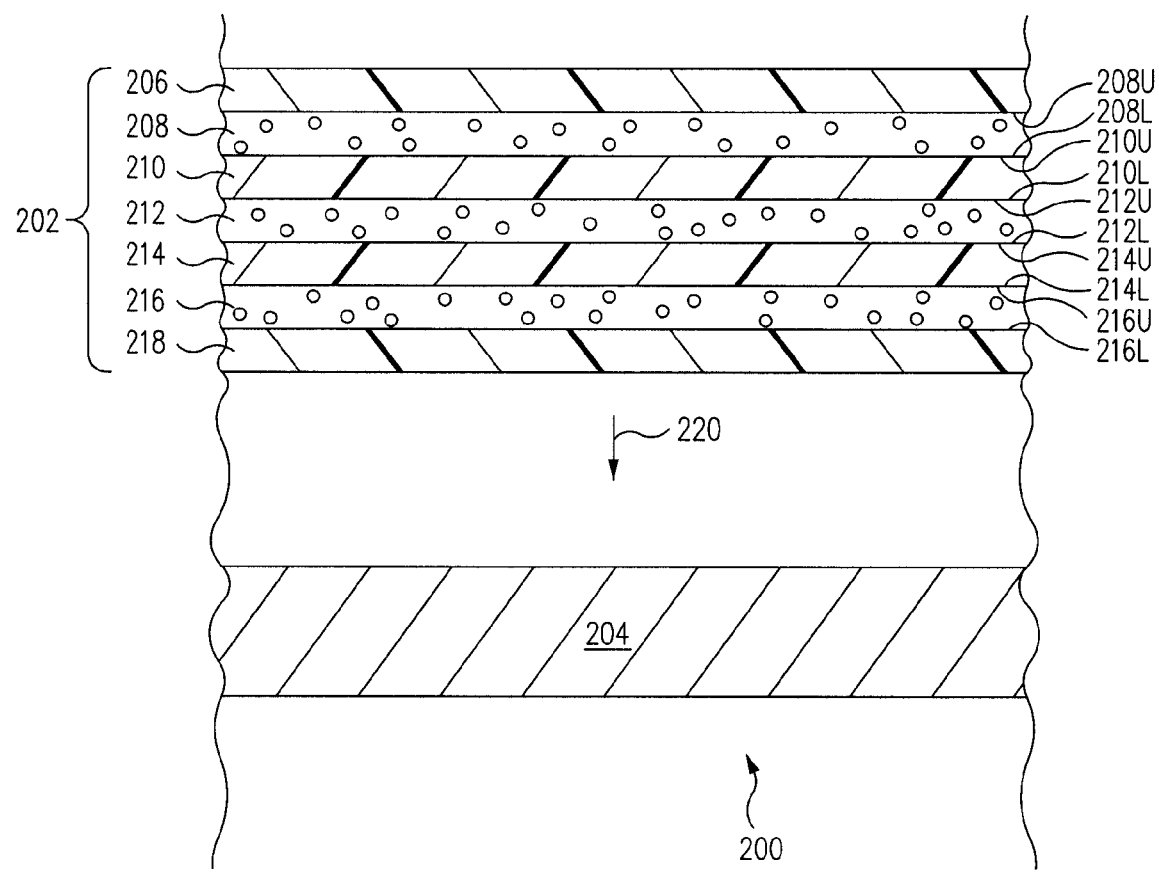
FIG. 2 is a cross-sectional view of an assembly during fabrication of a plurality of electronic component packages in accordance with one embodiment.
Figure 3:
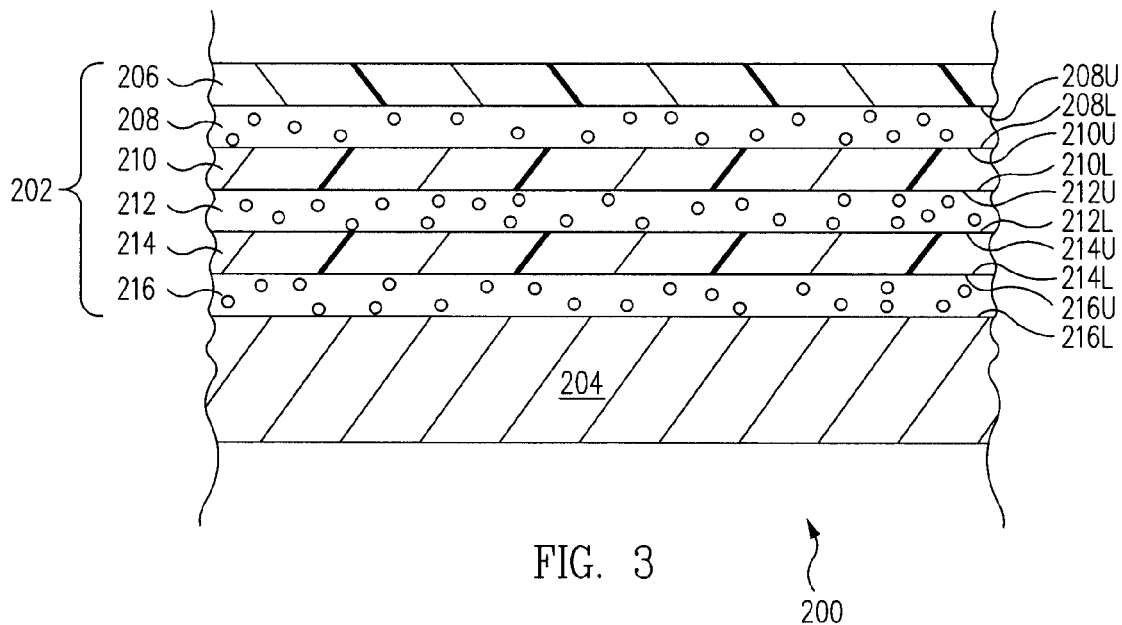
FIGS. 3, 4, 5, 6, and 7 are cross-sectional views of the assembly of FIG. 2 at later stages during fabrication of a plurality of electronic component packages in accordance with various embodiments.
Figure 4:
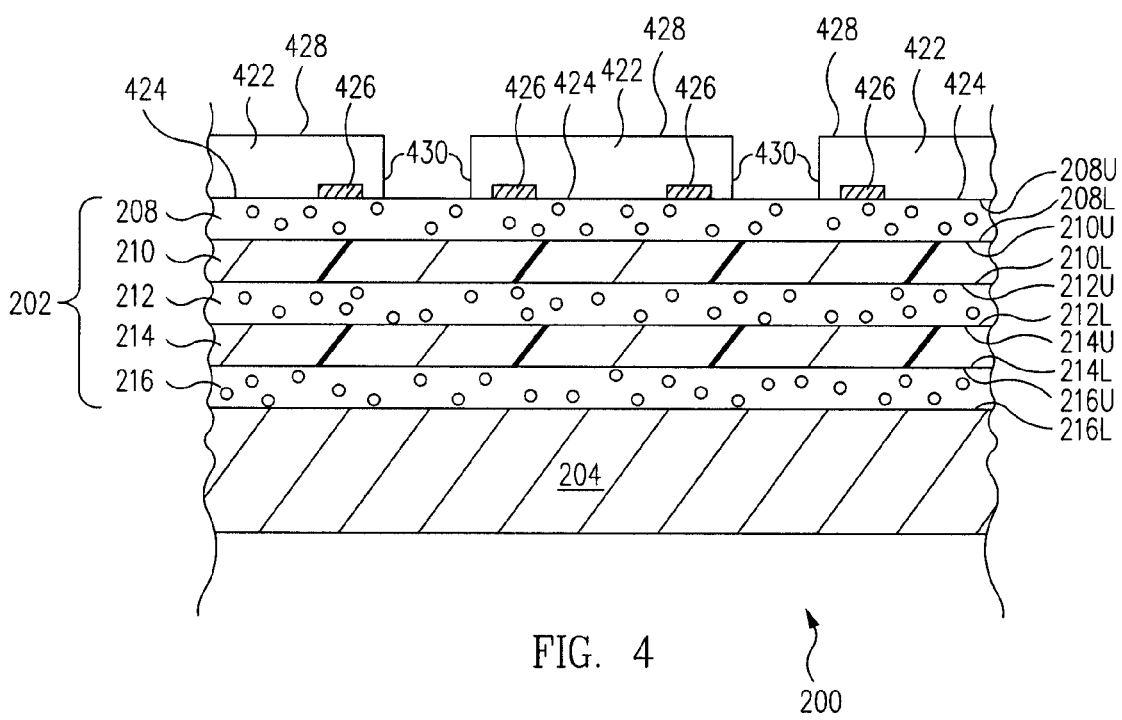
Figure 5:
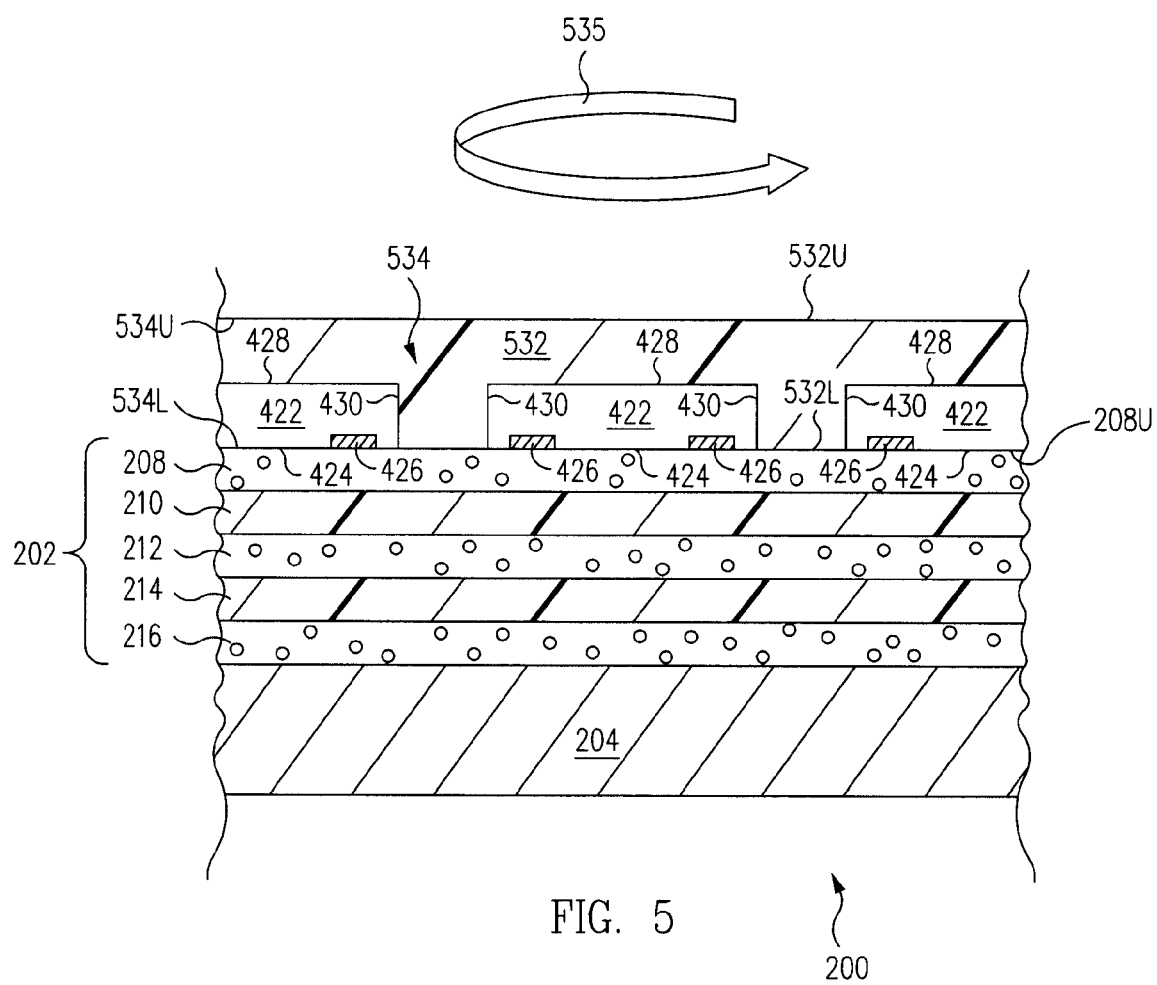
Figure 6:
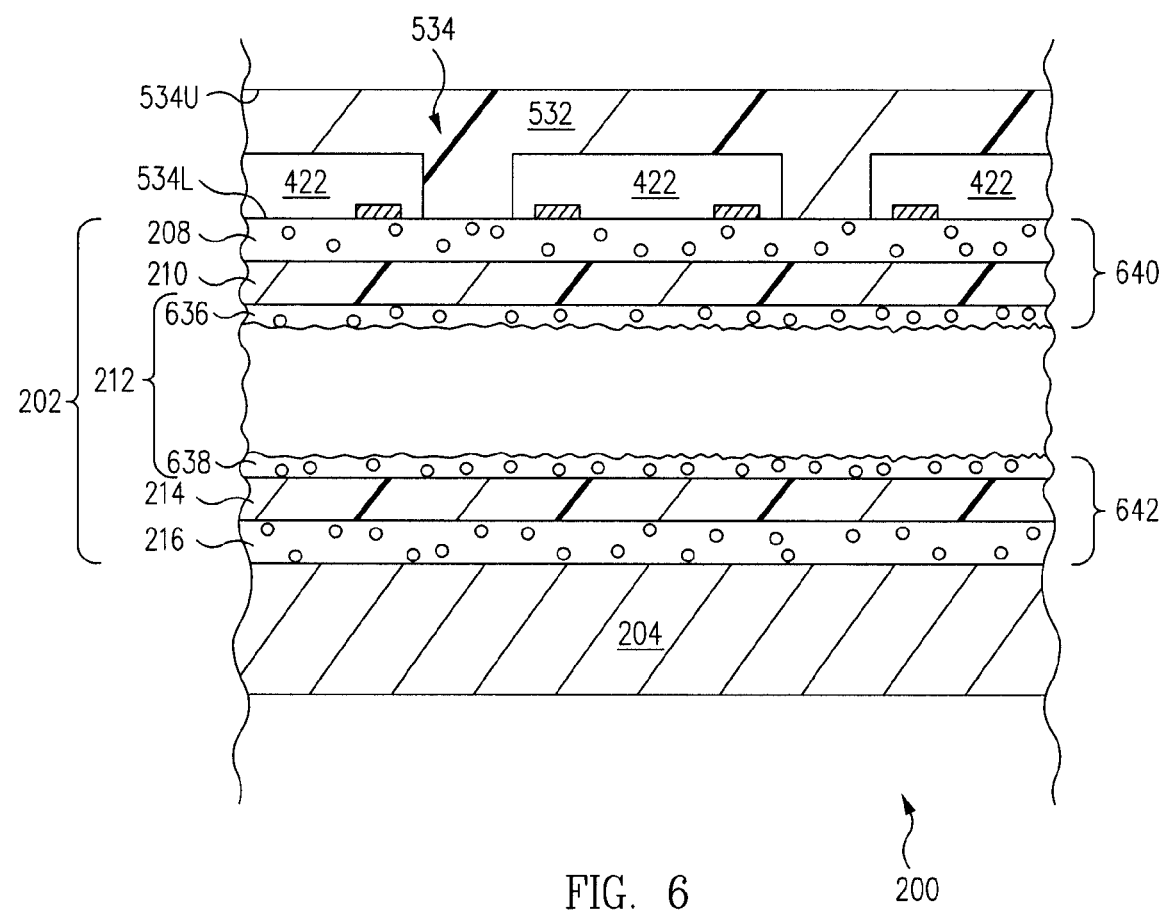

As an overview and in accordance with one embodiment, referring to FIGS. 2 and 3, a method of fabricating a plurality of electronic component packages includes coupling a tape 202 to a panel 204. Referring now to FIG. 4, electronic components 422 are coupled to tape 202. Referring now to FIG. 5, electronic components 422 are encapsulated to form a molded wafer 534. Referring now to FIGS. 5 and 6, molded wafer 534 is mechanically separated from panel 204 without heating by breaking a mechanical separation adhesive 212 of tape 202. By mechanically separating molded wafer 534 from panel 204 without heating, warpage of molded wafer 534 associated with heating is avoided.

Figure 1:
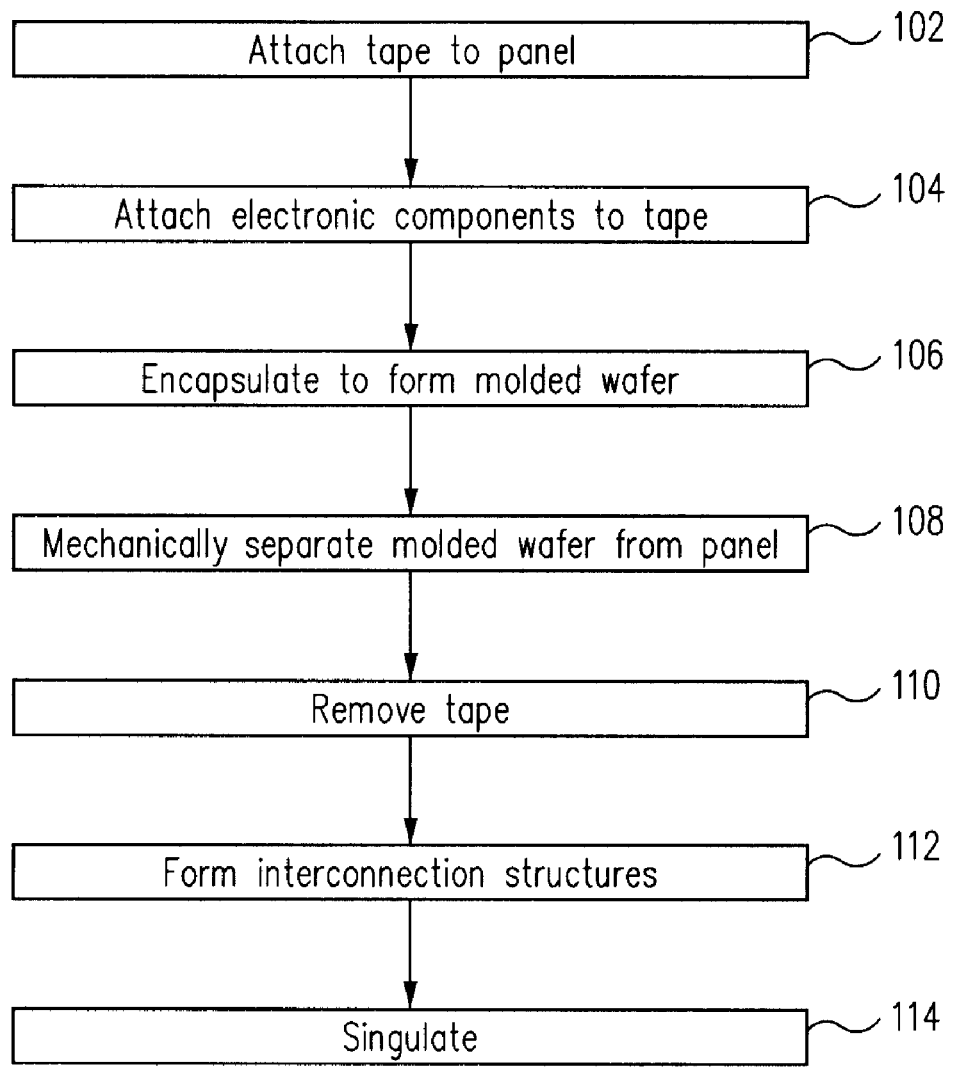
FIG. 1 is a block diagram of a mechanical tape separation package formation method in accordance with one embodiment.

Now in more detail, FIG. 1 is a block diagram of a mechanical tape separation package formation method 100 in accordance with one embodiment. FIG. 2 is a cross-sectional view of an assembly 200 during fabrication of a plurality of electronic component packages in accordance with one embodiment.

Referring now to FIGS. 1 and 2 together, in an attach tape to panel operation 102, a tape 202 is attached to a panel 204, sometimes called a carrier. Generally, panel 204 is a rigid material used to support electronic components during encapsulation as discussed further below. In one embodiment, panel 204 is a stainless steel plate although is formed of other materials in other embodiments.

Tape 202 acts as a bond agent for holding electronic components in place during molding as discussed below. Further, tape 202 allows for mechanical separation of panel 204 from the molded wafer as also discussed below.

Tape 202, sometimes called a die attach tape, includes five layers and two protective liners. More particularly, tape 202 includes an top, e.g., first, liner 206, a top, e.g., first, electronic component permanent adhesive 208, an upper, e.g., first, support tape 210, a mechanical separation adhesive 212, a lower, e.g., second, support tape 214, a bottom, e.g., second, panel permanent adhesive 216, and a bottom, e.g., second, liner 218.

Top electronic component permanent adhesive 208 includes an upper, e.g., first, surface 208U and a lower, e.g., second, surface 208L. Top electronic component permanent adhesive 208 is formed of an adhesive such that both upper and lower surfaces 208U, 208L are adhesive.

Top liner 206 is mounted to upper surface 208U of top electronic component permanent adhesive 208. Top liner 206, e.g., polyester or other removable material, protects upper surface 208U from contamination and/or from unintentional adherence to other structures.

Upper support tape 210 includes an upper, e.g., first, surface 210U and a lower, e.g., second, surface 210L. Upper support tape 210 provides support for tape 202 and separates top electronic component adhesive 208 from mechanical separation adhesive 212. In one embodiment, upper support tape 210 is formed of polyester or other supporting material.

Top electronic component permanent adhesive 208 is mounted to upper support tape 210. More particularly, lower surface 208L of top electronic component permanent adhesive 208 is mounted to upper surface 210U of upper support tape 210.

Mechanical separation adhesive 212 includes an upper, e.g., first, surface 212U and a lower, e.g., second, surface 212L. Mechanical separation adhesive 212 is formed of an adhesive such that both upper and lower surfaces 212U, 212L are adhesive.

Mechanical separation adhesive 212 provides a means for mechanically separating tape 202 as discussed further below. Mechanical separation adhesive 212 has less mechanical strength than the other layers of tape 202, i.e., has less mechanical strength than top electronic component permanent adhesive 208, upper support tape 210, lower support tape 214, and bottom panel permanent adhesive 216. Accordingly, mechanical separation adhesive 212 will preferentially break, sometimes called separate, before the other layers of tape 202, i.e., before top electronic component permanent adhesive 208, upper support tape 210, lower support tape 214, and bottom panel permanent adhesive 216. Stated another way, mechanical separation adhesive 212 is the weak link of tape 202 that will break before the other layers of tape 202.

Upper support tape 210 is mounted to mechanical separation adhesive 212. More particularly, lower surface 210L of upper support tape 210 is mounted to upper surface 212U of mechanical separation adhesive 212.

Lower support tape 214 includes an upper, e.g., first, surface 214U and a lower, e.g., second, surface 214L. Lower support tape 214 provides support for tape 202 and separates mechanical separation adhesive 212 from bottom panel permanent adhesive 216. In one embodiment, lower support tape 214 is formed of polyester or other supporting material.

Mechanical separation adhesive 212 is mounted to lower support tape 214. More particularly, lower surface 212L of mechanical separation adhesive 212 is mounted to upper surface 214U of lower support tape 214.

Bottom panel permanent adhesive 216 includes an upper, e.g., first, surface 216U and a lower, e.g., second, surface 216L. Bottom panel permanent adhesive 216 is formed of an adhesive such that both upper and lower surfaces 216U, 216L are adhesive.

Lower support tape 214 is mounted to bottom panel permanent adhesive 216. More particularly, lower surface 214L of lower support tape 214 is mounted to upper surface 216U of bottom panel permanent adhesive 216.

Bottom liner 218 is mounted to lower surface 216L of bottom panel permanent adhesive 216. Bottom liner 218, e.g., polyester or other removable material, protects lower surface 216L from contamination and/or from unintentional adherence to other structures.

FIG. 3 is a cross-sectional view of assembly 200 of FIG. 2 at a later stage during fabrication of a plurality of electronic component packages in accordance with one embodiment. Referring now to FIGS. 1, 2, and 3 together, in attach tape to panel operation 102, bottom liner 218 (FIG. 2) is removed to expose bottom surface 216L of bottom panel permanent adhesive 216. Tape 202 is moved towards panel 204 as indicated by the arrow 220 in FIG. 2 to press bottom surface 216L of bottom panel permanent adhesive 216 against panel 204. As bottom surface 216L is adhesive, pressing bottom surface 216L against panel 204 adheres bottom surface 216L, and thus tape 202, to panel 204 as illustrated in FIG. 3.

FIG. 4 is a cross-sectional view of assembly 200 of FIG. 3 at a later stage during fabrication of a plurality of electronic component packages in accordance with one embodiment. Referring now to FIGS. 1, 3 and 4 together, from attach tape to panel operation 102, flow moves to an attach electronic components to tape operation 104.

In attach electronic components to tape operation 104, electronic components 422 are attached to tape 202 as illustrated in FIG. 4. More particularly, top liner 206 (FIG. 3) is removed to expose upper surface 208U of top electronic component permanent adhesive 208.

Active surfaces 424 including bond pads 426 formed thereon are pressed against upper surface 208U of top electronic component permanent adhesive 208. As upper surface 208U is adhesive, pressing active surfaces 424 against upper surface 208U adheres active surfaces 424, and thus electronic components 422, to tape 202 as illustrated in FIG. 4.

In one embodiment, electronic components 422 are integrated circuit chips, e.g., are active components. However, in other embodiments, electronic components 422 are passive components such as capacitors, resistors, or inductors. In another embodiment, electronic components 422 are prepackaged devices. In yet another embodiment, a plurality of electronic components are mounted, e.g., in a stacked or side by side configuration.

In accordance with this embodiment, electronic components 422 include active surfaces 424 including bond pads 426, opposite inactive surfaces 428, and sides 430 extending perpendicularly between active surfaces 424 and inactive surfaces 428.

FIG. 5 is a cross-sectional view of assembly 200 of FIG. 4 at a later stage during fabrication of a plurality of electronic component packages in accordance with one embodiment. Referring now to FIGS. 1 and 5 together, from attach electronic components to tape operation 104, flow moves to an encapsulate to form molded wafer operation 106.

In encapsulate to form molded wafer operation 106, electronic components 422 are encapsulated, sometimes called encased, enclosed, molded, and/or covered, with a package body 532 to form a molded wafer 534. Package body 532 is a dielectric material, e.g., is molding compound formed by molding or encapsulant.

Package body 532 protects electronic components 422 from the ambient environment, e.g., from contact, moisture and/or shorting to other structures.

Package body 532 directly contacts and encapsulates inactive surfaces 428 and sides 430 of electronic components 422. Further, package body 532 directly contacts and encapsulates the portion of upper surface 208U of top electronic component permanent adhesive 208 exposed between electronic components 422.

Molded wafer 534 includes both electronic components 422 and package body 532. Generally, molded wafer 534 includes a lower, e.g., first, surface 534L defined by active surfaces 424 and a lower, e.g., first, surface 532L of package body 532. Further, molded wafer 534 includes an upper, e.g., second, surface 534U defined by an upper, e.g., second, surface 532U of package body 532.

Package body 532 is relatively rigid and provides strength and support for molded wafer 534. Accordingly, after formation of package body 532 and molded wafer 534, molded wafer 534 is removed from panel 204.

More particularly, from encapsulate to form molded wafer operation 106, flow moves to a mechanically separate molded wafer from panel operation 108. In mechanically separate molded wafer from panel operation 108, molded wafer 534 is mechanically separated from panel 204 without the application of heat.

FIG. 6 is a cross-sectional view of assembly 200 of FIG. 5 at a later stage during fabrication of a plurality of electronic component packages in accordance with one embodiment. Referring now to FIGS. 1, 5 and 6 together, generally, mechanical force is applied to mechanic separation adhesive 212 to break mechanical separation adhesive 212 apart as illustrated in FIG. 6. Breaking mechanical separation adhesive 212 causes molded wafer 534 to be mechanically separated from panel 204.

In one embodiment, mechanical force is applied to molded wafer 534 relative to panel 204. For example, as indicated by the arrow 535 in FIG. 5, panel 204 is held stationary while molded wafer 534 is twisted, or vice versa. This twisting force, sometimes called rotational force, is applied to tape 202 between molded wafer 534 and panel 204. As mechanical separation adhesive 212 is the weak link of tape 202, the twisting force causes mechanical separation adhesive 212 to break, sometimes called split or mechanically separate.

In one embodiment, a rotational force is applied to molded wafer 534 relative to panel 204 in the direction of a circle lying in a plane parallel to upper surface 532U of package body 532 to break mechanical separation adhesive 212.

In another embodiment, a shear force, sometimes called a linear force, is applied to molded wafer 534 relative to panel 204 for example by forcing molded wafer right in the view of FIG. 5 and in the direction parallel to upper surface 532U of package body 532 to break mechanical separation adhesive 212.

In another embodiment, a normal force, sometimes called a pulling force, is applied to molded wafer 534 relative to panel 204 for example by forcing molded wafer 534 up in the view of FIG. 5 and in the direction perpendicular to upper surface 532U of package body 532 to break mechanical separation adhesive 212.

However, other mechanical separation techniques to mechanically separate mechanical separation adhesive 212 are used in other embodiments. In one embodiment, a wedge such as a chisel is driven into mechanical separation adhesive 212 to break mechanical separation adhesive 212. In yet another example, mechanical separation adhesive 212 is cut, e.g., with a knife, to break mechanical separation adhesive 212.

Of importance, mechanical separation adhesive 212 is broken at ambient temperature, e.g., room temperature. More particularly, mechanical separation adhesive 212 is broken without heating of assembly 200. In this manner, warpage of molded wafer 534 associated with heating is avoided.

Paying particular attention now to FIG. 6, after mechanical separation of mechanical separation adhesive 212, mechanical separation adhesive 212 has been split into an upper, e.g., first, portion 636 and a lower, e.g., second, portion 638. Generally, tape 202 has been split into an upper, e.g., first, portion 640 and a lower, e.g., second portion 642. Top electronic component permanent adhesive 208, upper support tape 210, lower support tape 214, and bottom panel permanent adhesive 216 remain intact.

Upper portion 640 of tape 202 is attached to molded wafer 534 and lower portion 642 of tape 202 is attached to panel 204. Upper portion 640 of tape 202 includes top electronic component permanent adhesive 208, upper support tape 210, and upper portion 636 of mechanical separation adhesive 212. Lower portion 642 of tape 202 includes lower portion 638 of mechanical separation adhesive 212, lower support tape 214, and bottom panel permanent adhesive 216.

Figure 7:
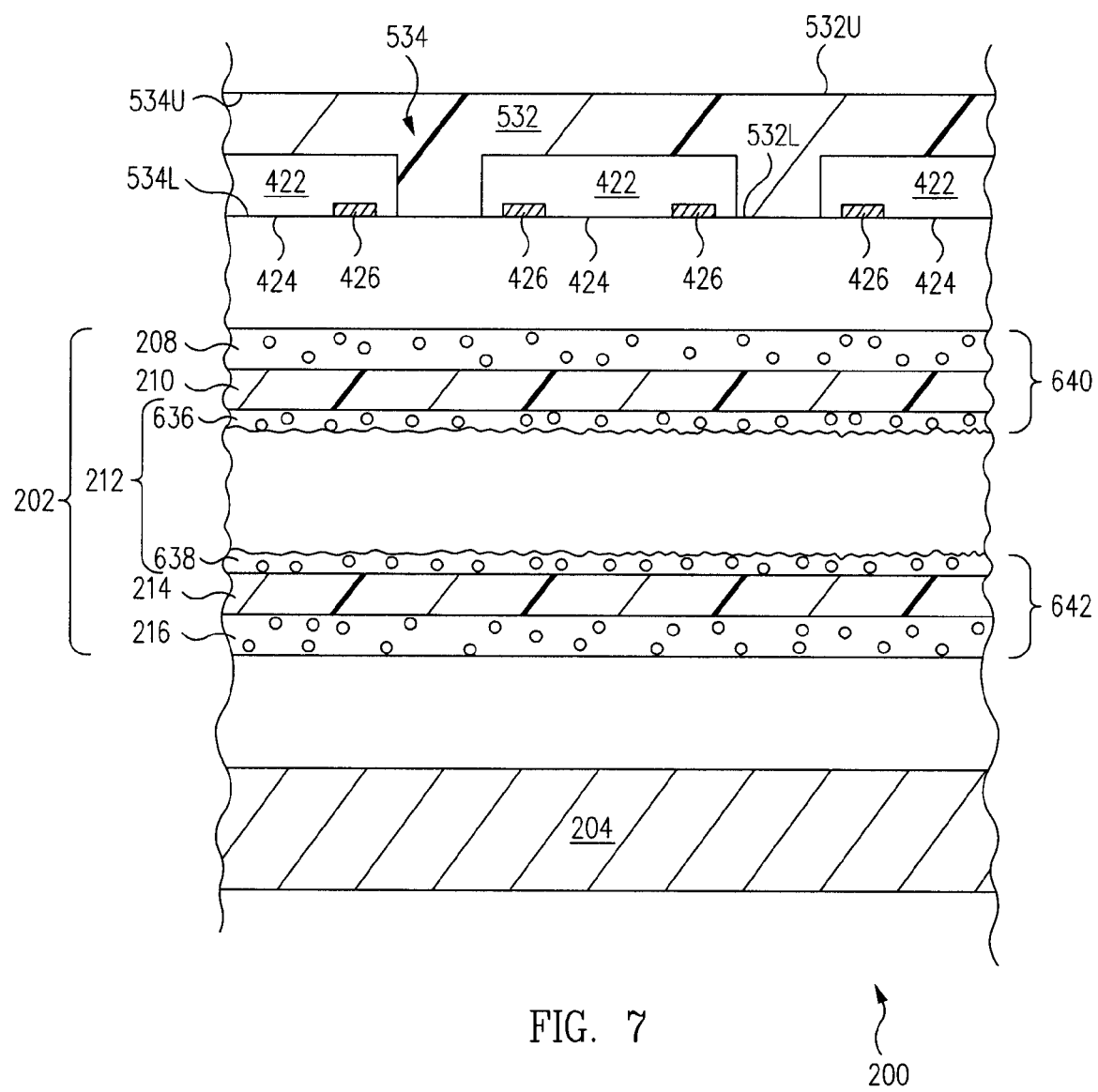

FIG. 7 is a cross-sectional view of assembly 200 of FIG. 6 at a later stage during fabrication of a plurality of electronic component packages in accordance with one embodiment. Referring now to FIGS. 1 and 7 together, from mechanically separate molded wafer from panel operation 108, flow moves to a remove tape operation 110. In remove tape operation 110, tape 202 is removed from molded wafer 534 and, optionally, from panel 204.

More particularly, upper portion 640 of tape 202 is removed from molded wafer 534, e.g., by peeling. Of importance, upper portion 640 of tape 202 is removed from molded wafer 534 at ambient temperature, e.g., room temperature. More particularly, upper portion 640 of tape 202 is removed from molded wafer 534 without heating of assembly 200. In this manner, warpage of molded wafer 534 associated with heating is avoided.

Further, lower portion 642 of tape 202 is removed from panel 204, e.g., by peeling. In one embodiment, after removal of lower portion 642 of tape 202, panel 204 is reused to fabricate another assembly.

Figure 8:
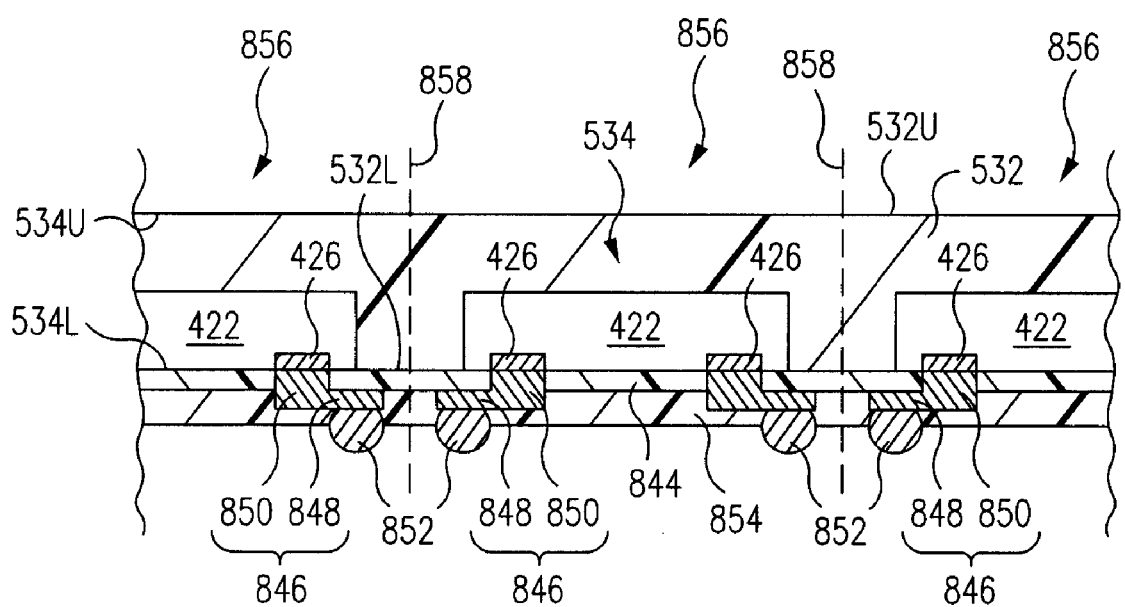
FIG. 8 is a cross-sectional view of a molded wafer of the assembly of FIG. 7 at a later stage during fabrication of a plurality of electronic component packages in accordance with one embodiment.

FIG. 8 is a cross-sectional view of molded wafer 534 of assembly 200 of FIG. 7 at a later stage during fabrication of a plurality of electronic component packages in accordance with one embodiment. Referring now to FIGS. 1 and 8 together, from remove tape operation 110, flow moves to a form interconnection structures operation 112.

In form interconnection structures operation 112, interconnection structures to provide electrical interconnection with bond pads 426 are provided. Although a particular interconnection structure is illustrated in FIG. 8 and discussed below, in light of this disclosure, those of skill in the art will understand that any one of a number of interconnection structures can be formed depending upon the particular application.

Referring now to FIG. 8, in accordance with this embodiment, a first dielectric layer 844 is applied to lower surface 534L of molded wafer 534. Via apertures are formed through dielectric layer 844 to expose bond pads 426.

A circuit pattern 846 is formed within the via apertures and electrically connected to bond pads 426. In accordance with this embodiment, circuit pattern 846 includes traces 848 formed on dielectric layer 844 and vias 850 extending through dielectric layer 844 to bond pads 426. Although traces 848 are illustrated as being formed on dielectric layer 844, in another embodiment, traces 848 are embedded within dielectric layer 844.

Interconnection balls 852, e.g., solder balls for example in a Ball Grid Array (BGA), are formed on traces 848, e.g., lands thereof. A second dielectric layer 854, e.g., a solder mask, is applied to cover and protect traces 848.

From form interconnection structures operation 112, flow moves to a singulate operation 114. In singulate operation 114, molded wafer 534 is singulated to form a plurality of electronic component packages 856, sometimes called Wafer Level Fan Out (WLFO) packages. Illustratively, molded wafer 534 is cut, e.g., by sawing, with a laser, or other cutting technique, on singulation streets 858 to form a plurality of individual electronic component packages 856.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
    coupling a tape to a panel, the tape comprises a mechanical separation adhesive;
    coupling electronic components to the tape;
    encapsulating the electronic components to form a molded wafer; and
    mechanically separating the molded wafer from the panel at ambient temperature comprising breaking the mechanical separation adhesive.

2. The method of claim 1 wherein the breaking the mechanical separation adhesive comprises applying a mechanical force to the molded wafer relative to the panel.

3. The method of claim 2 wherein the mechanical force comprises a rotational force.

4. The method of claim 2 wherein the mechanical force comprises a shear force.

5. The method of claim 2 wherein the mechanical force comprises a normal force.

6. The method of claim 1 wherein the breaking the mechanical separation adhesive comprises driving a wedge into the mechanical separation adhesive.

7. The method of claim 1 wherein the breaking the mechanical separation adhesive comprises cutting the mechanical separation adhesive.

8. The method of claim 1 wherein the mechanically separating is performed at room temperature.

9. The method of claim 1 wherein the mechanically separating is performed without heating the molded wafer.

10. A method comprising:
    coupling a panel permanent adhesive of a tape to a panel;
    coupling electronic components to an electronic component permanent adhesive of the tape, wherein the tape further comprises a mechanical separation adhesive between the panel permanent adhesive and the electronic component permanent adhesive.

11. The method of claim 10 wherein the mechanical separation adhesive has less mechanical strength than the panel permanent adhesive and the electronic component permanent adhesive.

12. The method of claim 10 wherein the mechanical separation adhesive provides a means for mechanically separating the tape.

13. The method of claim 10 further comprising encapsulating the electronic components to form a molded wafer; and breaking the mechanical separation adhesive at ambient temperature while leaving the electronic component permanent adhesive and the panel permanent adhesive intact.

14. The method of claim 13 wherein after the breaking, the tape comprises a first portion coupled to the molded wafer and a second portion coupled to the panel.

15. The method of claim 14 further comprising removing the first portion from the molded wafer at ambient temperature.

16. The method of claim 15 wherein the removing comprises peeling the first portion from the molded wafer.

17. A method comprising:
  coupling a tape to a panel, the tape comprising:
    an electronic component permanent adhesive;
    a first support tape coupled to the electronic component permanent adhesive;
    a mechanical separation adhesive coupled to the first support tape;
    a second support tape coupled to the mechanical separation adhesive; and
    a panel permanent adhesive coupled to the second support tape, wherein the mechanical separation adhesive has less mechanical strength than the panel permanent adhesive and the electronic component permanent adhesive;
  coupling electronic components to the electronic component permanent adhesive;
  encapsulating the electronic components to form a molded wafer; and
  breaking the mechanical separation adhesive.

18. The method of claim 17 wherein the breaking the mechanical separation adhesive separates the molded wafer from the panel.

19. The method of claim 17 wherein the coupling a tape to a panel comprises coupling the panel to the panel permanent adhesive.

* * * * *